United States Patent [19]

Cini et al.

[11] 4,045,745
[45] Aug. 30, 1977

[54] LOW-FREQUENCY POWER AMPLIFIER

[75] Inventors: Carlo Cini, Cornaredo (Milan); Bruno Murari, Monza (Milan); Mario Santi, Sedriano (Milan), all of Italy

[73] Assignee: SGS-ATES Componenti Elettronici S.p.A., Milan, Italy

[21] Appl. No.: 672,336

[22] Filed: Mar. 31, 1976

[30] Foreign Application Priority Data

Apr. 4, 1975 Italy .................................. 21984/75

[51] Int. Cl.² .............................................. H03F 3/26
[52] U.S. Cl. ........................................ 330/15; 330/22; 330/28
[58] Field of Search ..................... 330/13, 15, 17, 28, 330/22, 38 M, 40, 108, 149

[56] References Cited

U.S. PATENT DOCUMENTS 3,828,265   8/1974   Romano ..................... 330/38 M X

FOREIGN PATENT DOCUMENTS 1,259,952   2/1968   Germany ..................... 330/13
1,202,461   8/1970   United Kingdom ............ 330/13

Primary Examiner—James B. Mullins
Attorney, Agent, or Firm—Karl F. Ross

[57] ABSTRACT

A multistage operational amplifier designed as an IC chip, with a large feedback resistor inserted between its output terminal and its inverting input terminal, is provided with an external voltage divider between the output terminal and ground, this divider including a larger ungrounded resistor and a smaller grounded resistor. The junction between these two resistors is capacitively returned to the inverting input terminal.

2 Claims, 2 Drawing Figures

LOW-FREQUENCY POWER AMPLIFIER

1. Field of the Invention

Our present invention relates to a low-frequency power amplifier of the operational type, with a noninverting and an inverting input terminal and with a feedback resistor inserted between its inverting input terminal and its output terminal.

2. Background of the Invention

In commonly owned U.S. Pat. No. 3,828,265 there has been disclosed a three-stage power amplifier in the form of an integrated-circuit module or chip with a multiplicity of transistors, resistors and diodes. The various external connections of this IC module include, besides the aforementioned input and output terminals, a supply terminal connected to the live (e.g. positive) pole of a d-c supply, a ground lead and several ancillary terminals, one of the latter being tied to a junction of two resistors inserted as a voltage divider between the supply terminal and ground in series with one of two twin transistors forming part of a voltage-stabilizing circuit. The last-mentioned ancillary terminal can be grounded through a shunt capacitor (though that is not described in the patent) for the purpose of smoothing fluctuations of the supply voltage which could have an adverse effect upon the signal appearing on the output terminal.

The gain of such an operational amplifier is determined, as is well known, by the ratio of the magnitude of the aforementioned feedback resistor to an external impedance inserted between the inverting input terminal and ground; as shown in the prior patent referred to, this external impedance may comprise another resistor in series with a condenser. If the capacitance of this condenser is large enough to be negligible in the range of operating (e.g. audio) frequencies of the amplifier, the amplification factor A is given by the well-known formula $$A = 1 + R_1/R_2 \tag{1}$$

wherein $R_1$ and $R_2$ respectively represent the internal feedback resistor and the external resistor in series therewith. Resistor $R_1$, therefore, is generally made much larger than resistor $R_2$.

In the system of the prior patent, the second twin transistor of the voltage-stabilizing circuit draws current through the internal feedback resistor (referred to above as $R_1$) so that the voltage drop thereacross varies with the stabilizing current. Thus, unavoidable tolerances in the magnitude of this internal resistor among a multiplicity of mass-produced monolithic chips affect both the amplification factor A and the mean voltage of the output terminal, intermediate the supply voltage and ground, in the case of identical external circuitry. While the gain-determining ratio $R_1/R_2$ can be re-established by a proper dimensioning of the external and therefore readily accessible resistor $R_2$, such an adjustment has virtually no effect upon the mean output voltage inasmuch as the capacitance in series with resistor $R_2$ blocks the flow of direct current therethrough.

OBJECTS OF THE INVENTION

An object of our present invention is to provide simplified circuitry for a low-frequency power amplifier, or similar semiconductive devices, obviating the need for a separate terminal to be capacitively grounded in order to absorb supply-voltage fluctuations.

Another object is to provide, in an amplifier of the general type disclosed in prior U.S. Pat. No. 3,828,265, a single external circuit for voltage-stabilizing and gain-controlling purposes.

SUMMARY OF THE INVENTION

We realize these objects, in accordance with the present invention, by connecting a resistive voltage divider between the output and ground terminals, a tap on that voltage divider being returned to the inverting input terminal by way of a capacitor substantially compensating the effect of any supply-voltage fluctuations upon the voltage of the output terminal.

Advantageously, for reasons more fully discussed hereinafter, the voltage divider comprises a larger first resistance between the tap and the output terminal and a smaller resistance between the tap and the ground terminal. On the other hand, the magnitude of the internal feedback resistor ($R_1$) should substantially exceed the first resistance of the divider.

BRIEF DESCRIPTION OF THE DRAWING

The above and other features of our invention will now be described in detail with reference to the accompanying drawing in which.

SPECIFIC DESCRIPTION

Figure 1:
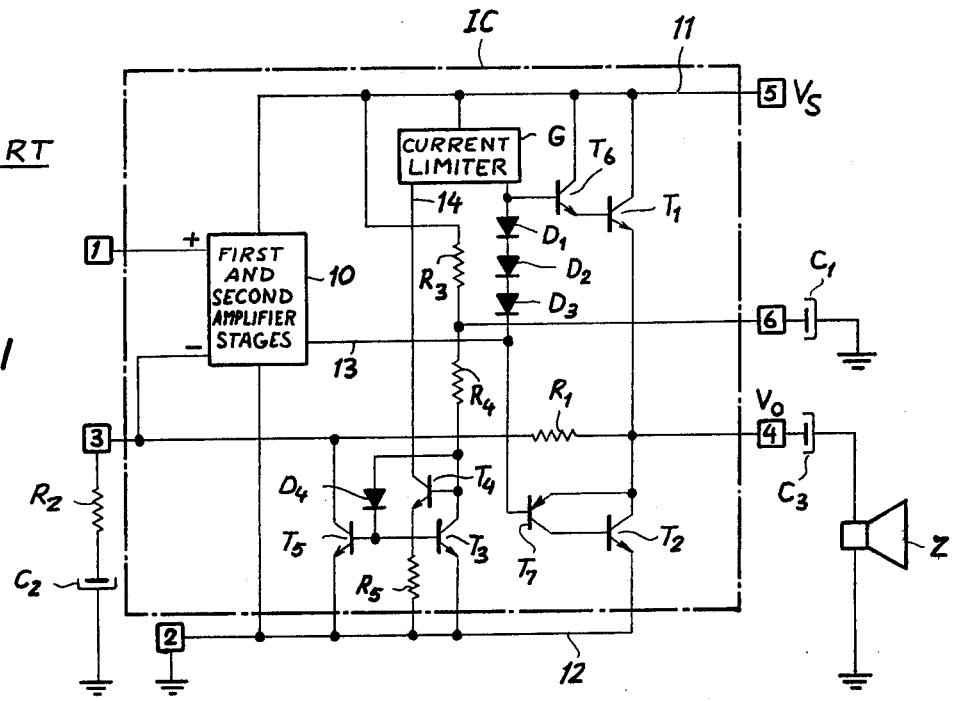
FIG. 1 is a circuit diagram of a conventional power amplifier generally similar to that shown in prior U.S. Pat. No. 3,828,265.

FIG. 1 represents a simplified presentation of an amplifier of the type disclosed in U.S. Pat. No. 3,828,265, including a monolithic chip IC with a number of terminals 1 - 6 giving access to its internal circuitry. That circuitry includes a transistorized amplification network with three cascaded stages, the first two stages being represented schematically by a block 10. The third or power stage includes a pair of NPN output transistors $T_1$, $T_2$ serially connected between a live (positive) bus bar 11 and a ground bus bar 12, bus bar 11 being tied to terminal 5 for connection to a d-c power supply (not shown) delivering a voltage $V_S$ to the network; bus bar 12 is tied to terminal 2. Power transistors $T_1$ and $T_2$ are controlled, in respective Darlington connections, by a pair of pilot transistors $T_6$ and $T_7$ of opposite conductivity types (NPN and PNP, respectively); the bases of these pilot transistors are biased by an output lead 13 of a current-limiting circuit G (details of which are shown in the aforementioned patent) with interposition of a low resistance, in the form of three cascaded diodes $D_1$ - $D_3$, between the bases of transistors $T_6$ and $T_7$. The current flow in lead 13 is determined by the second or intermediate amplification stage in block 10, under the control of a signal applied to terminal 1 which constitutes the noninverting input of the amplifier, and is modified by a voltage-stabilizing circuit including an NPN transistor $T_4$ whose collector is connected to another output of circuit G via a lead 14. The emitter of transistor $T_4$ is grounded through a resistor $R_5$ while its base is tied to the collector of another NPN transistor $T_3$ with a grounded emitter; a twin $T_5$ of transistor $T_3$, also with a grounded emitter, has its collector tied to terminal 3 which is the inverting input of the amplifier. The interconnected bases of twin transistors $T_3$ and $T_5$ are joined by way of a diode $D_4$ to the collector of transistor $T_3$ and thus to the base of transistor $T_4$; the current drawn by transistor $T_5$ substantially duplicates that drawn by its twin $T_3$.

A feedback resistor $R_1$, which like resistor $R_5$ forms part of the intergrated chip IC, lies between inverting input terminal 3 and terminal 4 which constitutes the output of the amplifier and which feeds a load connected between this terminal and ground, the load being here shown as a microphone Z in series with a coupling condenser $C_3$.

Two other resistors $R_3$ and $R_4$, also monolithically integrated in the chip IC, form a voltage divider connected between positive bus bar 11 and the collector of transistor $T_3$. The junction of resistors $R_3$ and $R_4$ is tied to terminal 6 which is grounded for alternating current through a capacitor $C_1$ designed to smooth any fluctuations of supply voltage $V_S$. Another external capacitor $C_2$ is inserted between ground and inverting input terminal 3 in series with an external resistor $R_2$ forming a gain-determining voltage divider with internal resistor $R_1$ as discussed above. The capacitance $C_2$ is negligible at the operating frequencies of the system but blocks the flow of direct current through resistor $R_2$.

It will be seen that the current drawn by transistor $T_5$, which matches the current passing through transistor $T_3$, traverses the resistor $R_1$ and thus affects the d-c potential $V_o$ existing on output terminal 4 in the absence of a signal. It will also be apparent that the magnitude of resistor $R_2$ has virtually no influence upon this d-c potential representing the mean output voltage.

Figure 2:
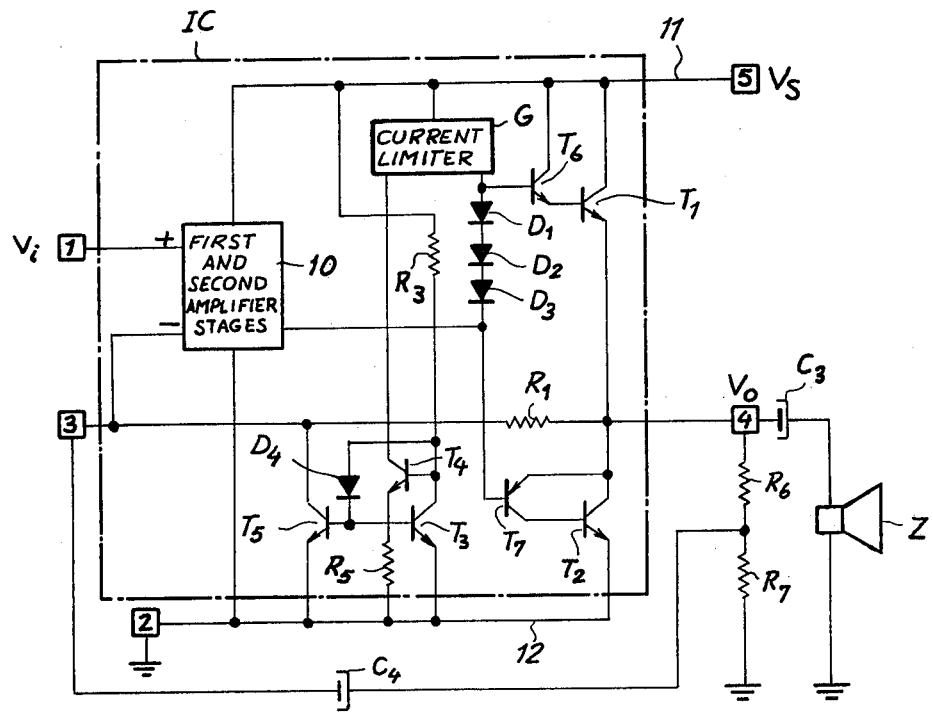
FIG. 2 is a circuit diagram showing the same kind of amplifier incorporating our present invention.

Reference will now be made to FIG. 2 showing a generally similar power amplifier whose internal circuitry, within chip IC, differs from that shown in FIG. 1 by the omission of resistor $R_4$ and of the connection leading from resistor $R_3$ to an external capacitance $C_1$ via an ancillary terminal 6. Output terminal 4, furthermore, is grounded through a voltage divider consisting of resistors $R_6$ and $R_7$ in series; a tap on this voltage divider, i.e. the junction of its two resistors, is returned to inverting input terminal 3 through a capacitance $C_4$.

A comparison between FIGS. 1 and 2 shows that capacitance $C_4$ and resistor $R_7$ play the part of elements $C_2$ and $R_2$ of the conventional amplifier lying in series with feedback resistor $R_1$. Thus, resistor $R_7$ in FIG. 2 determines the amplification factor A according to equation (1), it being therefore desirable that $R_1$ be considerably larger than $R_7$.

If $\Delta I_5$ is the fluctuation of the collector current of transistor $T_5$ due to a fluctuation $\Delta V_S$ of the supply voltage $V_S$, we may write $$\Delta I_5 = (\Delta V_S / R_3) \tag{2}$$

(neglecting the collector-emitter resistances of conducting transistors $T_3$ and $T_5$) in view of the substantial equality of the current flow through the twin transistors. The influence of this current fluctuation $\Delta I_5$ upon the output voltage $V_o$ can be represented, neglecting the small flow through the large feedback resistor $R_1$, as follows:

$$\Delta V_o = -\Delta I_5 \left( \frac{1}{j\omega C_4} + \frac{R_6 R_7}{R_6 + R_7} \right) \cdot \frac{R_6 + R_7}{R_7} \tag{3}$$

With $R_6 \gg R_7$, and with substitution of equation (2) into equation (3), the output-voltage fluctuation $\Delta V_o$ is given by the simplified equation (neglecting the minus sign)

$$\Delta V_o = \frac{\Delta V_S}{R_3} \cdot (R_7 + \frac{1}{j\omega C_4}) \frac{R_6}{R_7} \tag{4}$$

In the latter equation the fluctuation $\Delta V_o$ becomes a small fraction of $\Delta V_S$ if $R_6 \ll R_3$ and $X_4 \ll R_6$, $X_4$ being the impedance of capacitor $C_4$ at the operating frequencies.

Thus, with impedance $X_4$ negligible for the signal currents, terminal 3 is linked with terminal 4 by two essentially resistive parallel branches $R_1$, $R_6$ and is grounded through resistor $R_7$. With $R_1 \gg R_6$, the ratio between an input voltage $V_i$ at terminal 1 (which is essentially duplicated at terminal 3) and the corresponding output voltage $V_o$ is given by $$V_i = \frac{V_o}{R_6 + R_7} R_7 \tag{5}$$

whence the amplification factor A is given by $$A = \frac{V_o}{V_i} = \frac{R_6 + R_7}{R_7} = 1 + \frac{R_6}{R_7} \tag{6}$$

It will thus be seen that the gain of the amplifier of FIG. 2 is determined by two external resistance elements $R_6$ and $R_7$ which can be easily adjusted to the desired values independently of the circuit constants of chip IC. With elimination of terminal 6 shown in FIG. 1, our improved amplifier may be mounted on a socket or supporting strip with five terminals (including ground terminal 2) from which the external connections can be extended with the aid of a 5-tongue lead frame of the type described in commonly owned application Ser. No. 508,951 filed September 23, 1974 by Raimondo Paletto.

It will further be noted that in contradistinction to the system of FIG. 1, which comprises two external capacitances $C_1$, $C_2$ and one external resistance $R_2$, our improved system has two external resistances $R_6$, $R_7$ and one external capacitance $C_4$ which can be more economically produced. The elimination of resistor $R_4$ within chip IC further simplifies the structure.

Our present invention is not limited to a power amplifier of the type discussed but is applicable to other semiconductive devices, especially those of the integrated-circuit type, in which fluctuations of a supply voltage are to be compensated to minimize their effect upon the output of an amplification stage.

We claim:
1. A power amplifier comprising:
an amplification network with several cascaded transistor stages including a first stage and a final stage, said first stage having a noninverting input terminal and an inverting input terminal;
an energizing circuit for said network including a supply terminal and a ground terminal connectable across a source of direct current;
a first power transistor and a second power transistor in said final stage connected between said supply terminal and said ground terminal, said power transistors being respectively provided with a collector and an emitter jointly connected to an output termi- nal, said power transistors having input circuits connected to said first stage;

a feedback resistor inserted between said output terminal and said inverting input terminal;

a first resistance substantially smaller than the magnitude of said feedback resistor connected to said output terminal;

a second resistance substantially smaller than said first resistance connected to said ground terminal and forming a junction with said first resistance;

a capacitor inserted between said inverting input terminal and said junction for substantially compensating the effect of supply-voltage fluctuations upon the voltage of said output terminal; and a voltage-stabilizing circuit with a pair of twin transistors having interconnected bases and grounded emitters, one of said twin transistors having a collector tied to said inverting input terminal, the other of said twin transistors having a collector connected to said supply terminal via a direct-current path independent of said input circuits including a further resistor of a magnitude substantially exceeding said first resistance.

2. A power amplifier as defined in claim 1 wherein said network, said energizing circuit, said voltage-stabilizing circuit and said feedback resistor are part of an integrated-circuit module.

* * * * *